(12) United States Patent
Argyres

(10) Patent No.: US 6,317,379 B1
(45) Date of Patent: Nov. 13, 2001

(54) DETERMINE OUTPUT OF A READ/WRITE PORT

(75) Inventor: Dimitri C Argyres, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/507,506

(22) Filed: Feb. 18, 2000

(51) Int. Cl.$^7$ ...................................................... G11C 8/00
(52) U.S. Cl. .............................. 365/230.05; 365/189.07; 365/189.11; 365/203
(58) Field of Search ................................ 365/230.05, 203, 365/189.05, 189.11, 189.07, 230.06, 189.04

(56) References Cited

U.S. PATENT DOCUMENTS

| | | | |
|---|---|---|---|
| 5,659,711 | * 8/1997 | Sugita | 711/144 |
| 5,768,211 | * 6/1998 | Jones et al. | 365/230.05 |
| 5,859,999 | 1/1999 | Morris et al. | 395/565 |
| 5,860,017 | 1/1999 | Sharangpani et al. | 395/800.23 |
| 6,070,256 | * 5/2000 | Wu et al. | 714/718 |
| 6,122,218 | * 9/2000 | Kang | 365/230.05 |

OTHER PUBLICATIONS

Wolfe, A., "Patents shed light on Merced's Innards", Electronic Engineering Times, Feb. 15, 1999.

* cited by examiner

Primary Examiner—David Nelms
Assistant Examiner—Gene N. Auduong

(57) ABSTRACT

An apparatus for and a method of ensuring a proper read output level of a multi-port memory during a dual write operation, i.e., when the same memory location is being written to by at least two ports, are described. Upon an indication that at least two ports are being accessed, and that the address match between at least two ports has occurred, the read outputs of, e.g., a read/write port, are forced to a known voltage, i.e., a hard one or a hard zero. In one implementation of the present invention, a dynamic bolt-on circuit is provided to dynamically pull down the precharge signal upon a determination that a dual write condition has occurred to, e.g., force the outputs to hard zero. In another implementation of the present invention, a logic circuit is provided at the end of the output to mask the actual value of the output, and to provide a known voltage, e.g., ground or $V_{DD}$, to entities external to the memory cell.

20 Claims, 7 Drawing Sheets

DETERMINE OUTPUT OF A READ/WRITE PORT

TECHNICAL FIELD

The invention relates to computer memory devices. More particularly, the invention relates to electronic devices and methods for ensuring proper read outputs of a write/read port of a multi-port memory, e.g., a dual port RAM.

BACKGROUND ART

A modern computer system is typically equipped with multiple processors (albeit on a single chip) processing many instructions (or kernels) in parallel. Each of the multiple processors requires real time independent access to a common memory shared by the processors to store and retrieve instructions and/or data needed to process the instructions. In other words, the processors need simultaneous and independent access to the same shared memory device. To accomplish this functionality, a memory with multiple access ports can be used. Moreover, a multiple access port memory may be useful in any application in which simultaneous multiple access is required, e.g., pipelined cache applications.

There is, however, a limit on how many access ports can be provided in a single memory device. The limit is due to, e.g., inter alia, constraints in the ability provide many layers of metal runs during chip manufacturing, and the complexity of logic circuitry to arbitrate accesses of memory cells between the processors. Typically, the number of ports is limited to between two and four ports. These ports may be a combination of read and/or write ports.

For example, a conventional dual port random access memory (RAM) 100 shown in FIG. 1. The RAM comprises a memory cell core 101 comprising an array of memory cells. The memory cells are typically arranged as a plurality of rows and columns, and are individually addressable using the corresponding row and column locations, e.g., ARRAY (row, column), as the indices for their address. The write port address decoder 104 and the read/write port address decoder 105 generate the row and column addresses from the write address 107 and the read/write address 110 input thereto, respectively.

The dual port RAM 100 includes a write port P1 comprising the write data input 106 and the write address input 107, and a read/write port P2 comprising the read data output 112, the write data input 111 and the read/write address input 110. The write port P1 and the read/write port P2 each provide independent access to the memory core 101 by more than one entity. When an entity wishes to write to the write port, it must present the data to be written, the address of the cell to which the data is to be written, at the write data input 106 and the write address input 107, respectively, as well as a control signal, e.g., inter alia, write enables, at the control signal input 108. Likewise, when an entity wishes to write to the read/write port, it needs to present the data and the address of the cell at the write data input 111 and the read/write address input 110, respectively, and a control signal at the control signal input 109.

Additionally, the read/write port may be accessed to read data contained in one or more of the memory cells 101. A dynamic read operation is performed when the address of the cell from which to read is provided at the read/write address input 110. During a read operation, the content of the memory cell corresponding to the read address is output at the read data output 112.

The control and address arbitration logic 102 provides the necessary control signals and arbitration of the access to the memory cell core 101 between the two ports, particularly when an access of the same memory cell is sought by both of the ports at the same time.

The precharge circuit 103 comprises a precharge and hold circuit for dynamically precharging the read outputs with the supply voltage level ($V_{DD}$) during a read operation. The practice of precharging the outputs to implement dynamic read operations is well known to those familiar with memory designs.

FIG. 2 shows an example of a precharge and hold circuit 200 of a conventional memory, e.g., the dual port RAM 100 of FIG. 1. The precharge and hold circuit 200 includes a transistor Q1 205 which ensures that the precharging of the outputs (shown in the example as the port pad 210 representing a plurality of outputs of one or more banks of memory cells, e.g., a 64×1 bank comprising 64 cells) are precharged, i.e., dynamically pulled up to the supply voltage ($V_{DD}$), only during a proper clock cycle, e.g., when the clock signal received from the clock input 201 is LOW. The transistors, Q3 207, Q4 208 and Q5 209 collectively regulate the holding of the charge during the next clock phase, e.g., while the clock is HIGH.

By bringing together the outputs of a plurality of memory cells, typically referred to as a bank, to the port pad 210, a precharge and hold circuit 200 may be provided for each bank of cells rather than to each individual cell.

FIG. 3 shows an exemplary block diagram of the relevant portions of a single memory cell 300, e.g., a cell from the bank of cells connected to the port pad 210, and of which the precharge signal 304 corresponds to the voltage level of the port pad 210. The logic level of the output 302 depends on the logic state contained in the cell logic 301. For example, if the cell logic 301 contains therein a zero (0), then the output 302 is pulled down by the cell logic 301 to output a zero (0). If on the other hand the cell logic 301 contains a logic one (1), then the output 302 outputs the pulled up voltage, i.e., VDD, to output a logic one (1). Of course, the memory cell may be designed so that the output 302 may be an inverted output, i.e., when the cell logic 301 contains therein a zero (0),then the output 302 is pulled up to output a one (1).

Unfortunately, the conventional multi-port memories described above suffer from significant drawbacks. Unknown and unstable output voltage levels may be read from the read outputs of the read/write port during a write operation to the port, particularly during a multiple write operation (i.e., the same memory cell is being written into from more than one port). The unknown and unstable output voltage levels may cause a degradation of the integrity of the semiconductor device and/or the logic signals within the memory device. In particular, for example, in a conventional dual port RAM 100 described above, when a logic one (1) is being written to a cell from the write port, and a logic zero (0) is being written to the same cell from the read/write port substantially simultaneously, the output 302 may be partially switched, and may end up outputting a voltage level somewhere between $V_{DD}$ and GND. The in between voltage may be close to the threshold voltage for, and thus may cause oscillations of, other switches (or transistors) of the memory circuitry, and may therefore be detrimental to the integrity of the memory device.

Moreover, the arbitrary nature of the above conventional multi-port memories makes it difficult to test the memory device, e.g., for design and/or performance verification.

Attempts to alleviate the above problems heretofore have involved addition of elaborate arbitration and decoder circuitry to altogether disable the read operation during a write operation. However, the addition of the arbitration and decoder circuitry exacerbates the physical semiconductor space constraints discussed above, and adds delay. This delay may result in violation of designed timing allocation, and thus would require a redesign.

There is therefore a need for a more efficient and robust method and device for ensuring deterministic logic levels. There is a need for ensuring deterministic logic levels of the read outputs of a read/write port of a multi-port memory without a significant additional circuitry and design complexity.

SUMMARY OF INVENTION

A method and apparatus for providing deterministic read output valves for a multi-port memory are described. More specifically, a method of, and an apparatus for, providing a deterministic read output value of a multi-port memory having at least a first port and a second port comprises, steps of and means for, respectively, detecting a write to a first address is being performed through the first port, detecting a write to a second address being performed through the second port, comparing the first address and the second address, and setting an output value of at least one output of the multi-port memory at a predetermined voltage level if the first address matches the second address.

In addition, a dynamic bolt-on circuit for a memory is described. More particularly a dynamic bolt-on circuitry for a memory having at least a first port and a second port comprises a precharge signal path adapted to precharge a plurality of read outputs with a first voltage level, a first switch disposed to provide an electrical connection between the precharge signal path and a second voltage level when the first switch is closed, and a first signal path adapted to receive a match signal, the match signal controlling opening and closing of the first switch, the match signal being active to close the first switch when respective addresses of the first port and the second port match each other.

DESCRIPTION OF DRAWINGS

Features and advantages of the present invention will become apparent to those skilled in the art from the following description with reference to the drawings, in which.

DETAILED DESCRIPTION OF PREFERRED EMBODIMENT

For simplicity and illustrative purposes, the principles of the present invention are described by referring mainly to an exemplar embodiment, particularly, with references to an example in which a specific circuit design is implemented. However, one of ordinary skill in the art would readily recognize that the same principles are equally applicable to, and can be implemented in, other circuit designs, and that any such variation would be within such modifications that do not depart from the true spirit and scope of the present invention.

The method of and apparatus for deterministic read outputs of a read/write port of multi-port memory in general detects a simultaneous write to the same memory cell or cells through more than one port, and forcibly sets the read outputs with a predetermined logic state.

Figure 4:
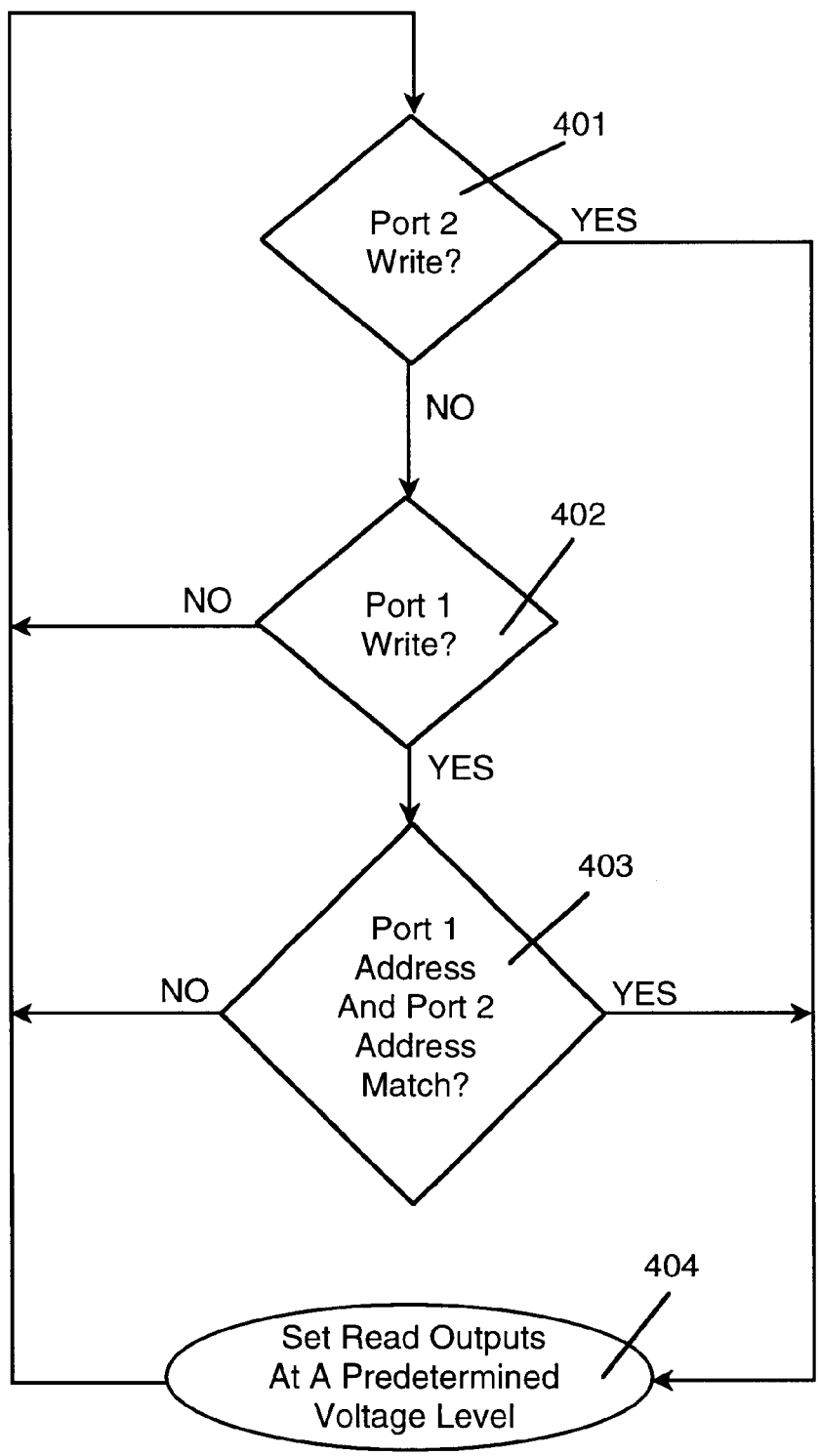
FIG. 4 is a flow diagram of an exemplary embodiment of the deterministic output ensuring method in accordance with the principles of the present invention.
Figure 5:
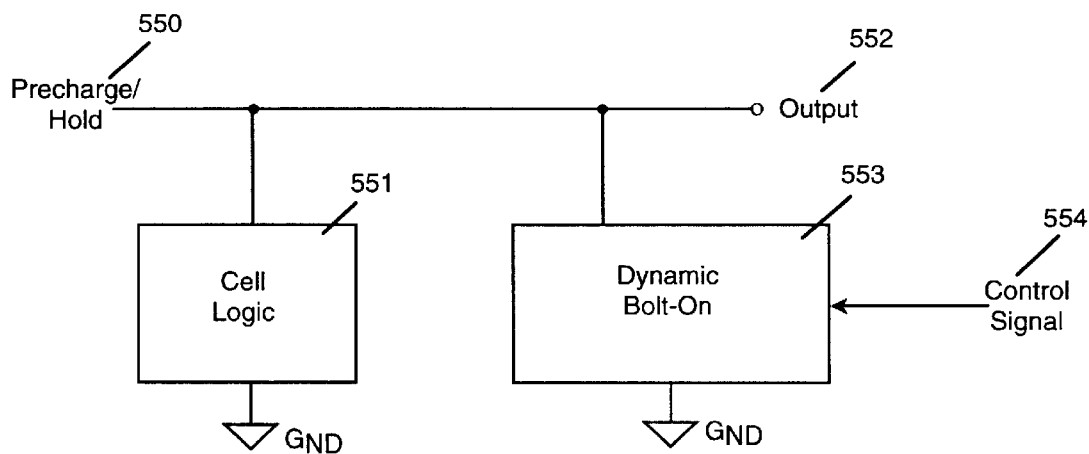
FIG. 5 is a block diagram of an exemplary embodiment of the dynamic bolt-on circuitry in accordance with the principles of the present invention.
Figure 5A:
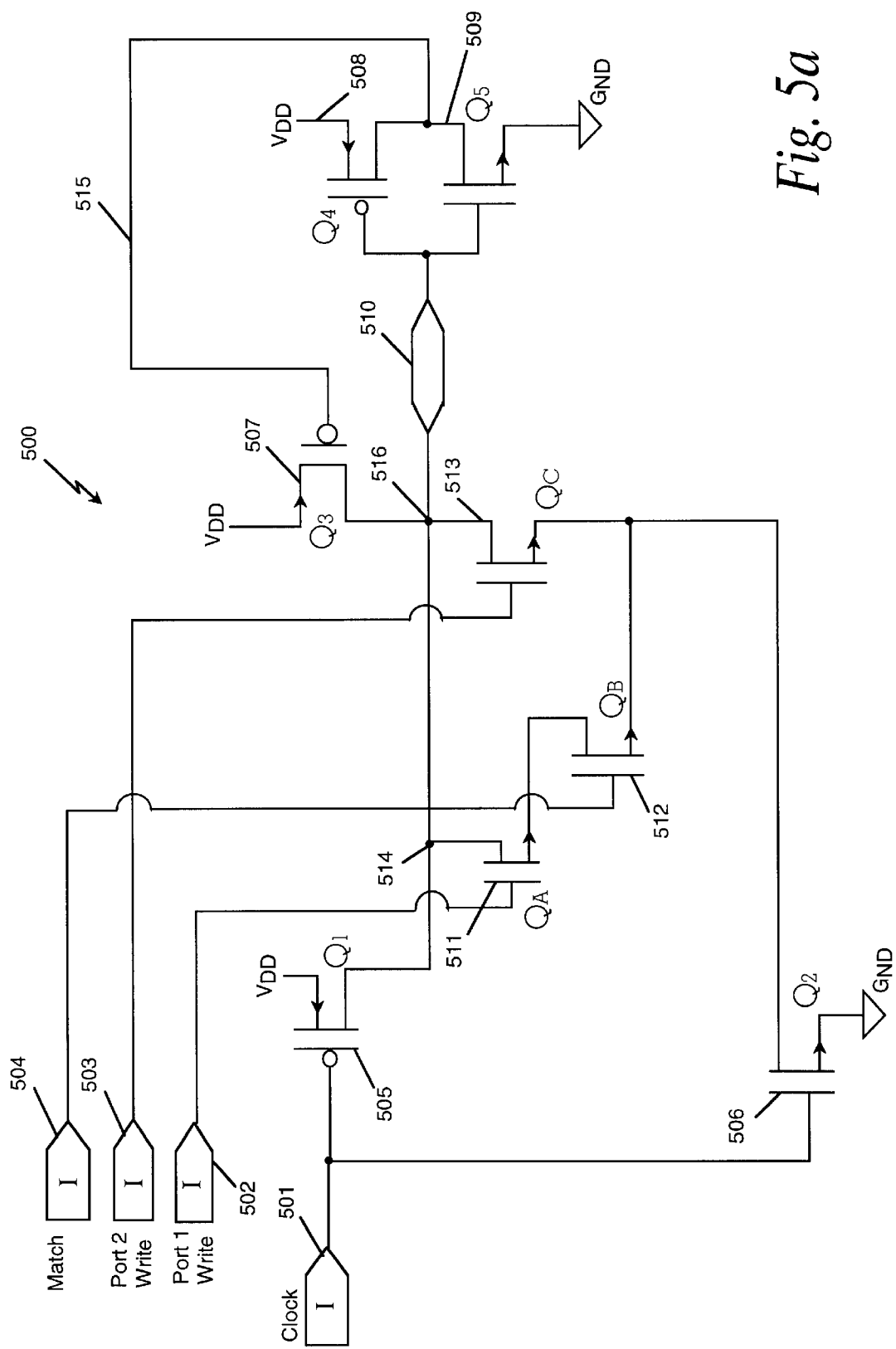
FIG. 5A is a logic diagram of an exemplary embodiment of the precharge and hold circuitry including the dynamic bolt-on circuitry in accordance with the principles of the present invention.

FIG. 4 shows a flow diagram of an exemplary embodiment of the deterministic output ensuring method. FIGS. 5 and 5A show an exemplary embodiment of an apparatus that may be used to implement the method of FIG. 4. For simplicity, the exemplary embodiment is described with reference to a dual port memory, i.e., having two ports, port 1 and port 2. However, it should be readily apparent to those skilled in the art that the same principles would be equally applicable to a memory having any number of ports.

According to the embodiment of the inventive method shown in FIG. 4, a determination whether a write operation is being performed in the read/write port (port 2) is made in step 401. The determination may be made by, e.g., examining the logic state of the write enable control signals of port 2. If it is determined that no write operation is presently being performed in port 1, then the process proceeds to step 402. If it is determined that a write operation is being performed in port 2, then the process proceeds to step 404, during which the read outputs are set to a predetermined voltage. The outputs may be pulled up high, i.e., to the supply voltage ($V_{DD}$), or may be pulled down low, i.e., to the ground (GND) level. Thus, if a write operation is being performed to the read/write port (port 2), then the read outputs of the port are set to a deterministic value.

In step 402, a determination of whether a write operation is being performed in the write port (port 1) is made. The determination may be made by, e.g., examining the logic state of the write enable control signals of the port 1. If it is determined, during step 402, that no write operation is presently being performed in port 1, then the process returns to the step 401, and step 401 is repeated. If it is determined that a write operation is being performed in port 1, then the process proceeds to the next step, step 403. In step 403, the address being accessed by the port 1 is compared to the address being accessed by port 2 to determine if there exists a match between the addresses.

If the addresses do not match, the process returns to step 401, the step 401 is repeated. If on the other hand, the addresses do match, the read outputs are set to a predetermined voltage level during step 404. The outputs may be pulled up high, i.e., to the supply voltage ($V_{DD}$), or may be pulled down low, i.e., to the ground (GND) level. Finally, the process returns to step 401, step 401 is repeated.

As can be appreciated, in the above described inventive method, the read outputs of the multi-port memory are set to a known voltage level, e.g., a "hard 0" or a "hard 1", when port 2 is being written to or when port 1 is being written to while the address match signal is true. Thus, preventing a unknown and potentially detrimental voltage level to be output at the read outputs.

Figure 1:
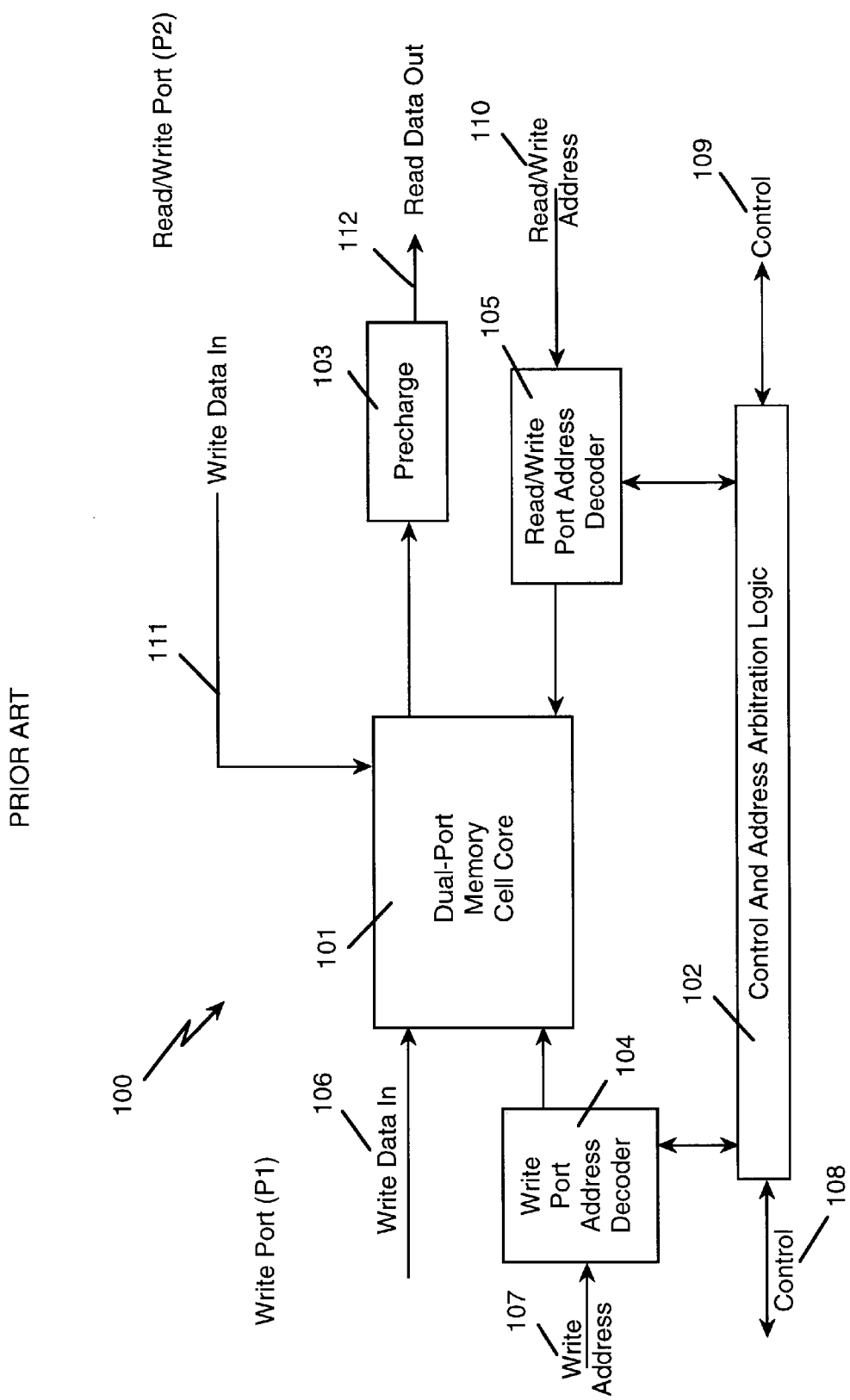
FIG. 1 is a block diagram of the relevant portions of a conventional dual port random access memory (RAM).
Figure 2:
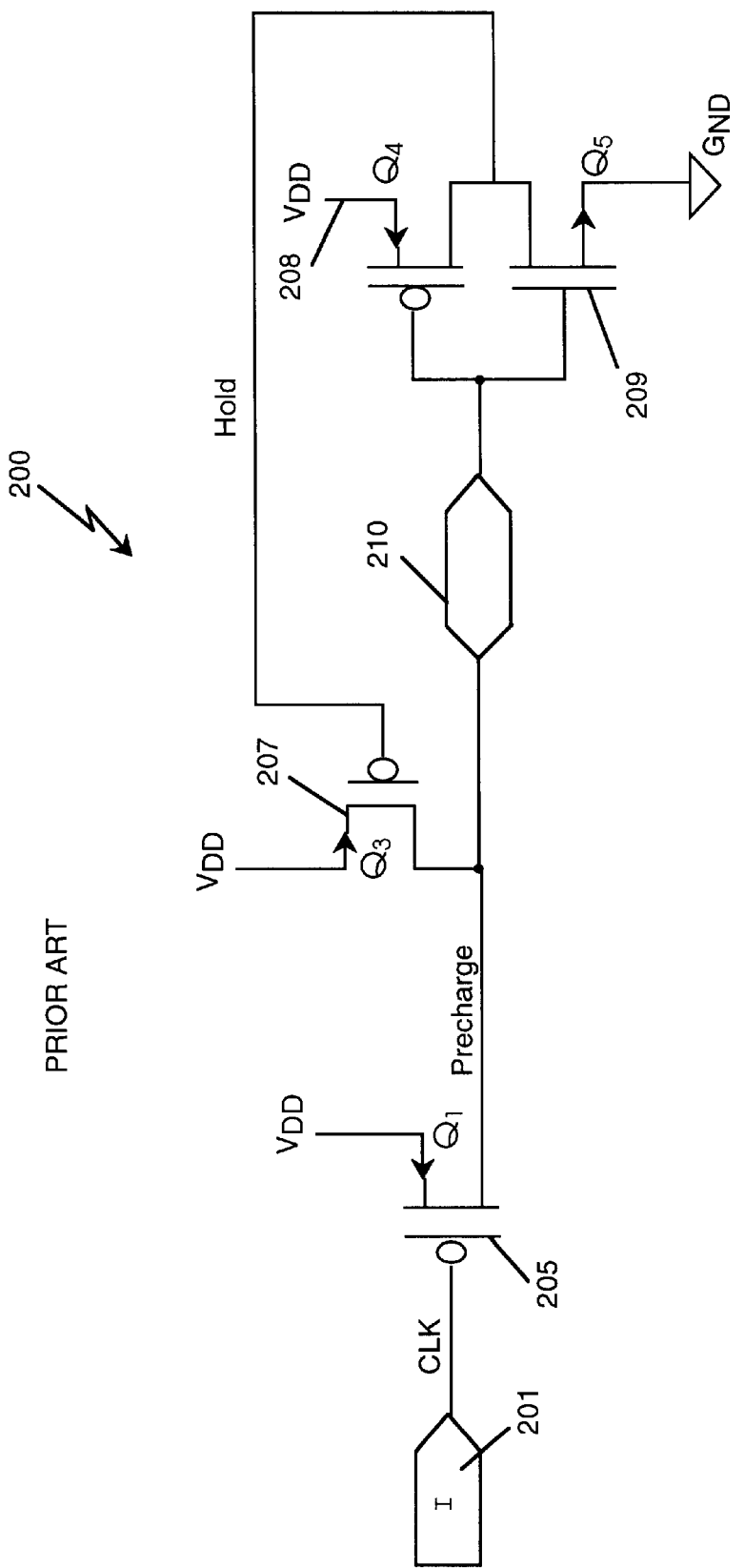
FIG. 2 is a block diagram of a conventional precharge and hold logic circuitry.
Figure 3:
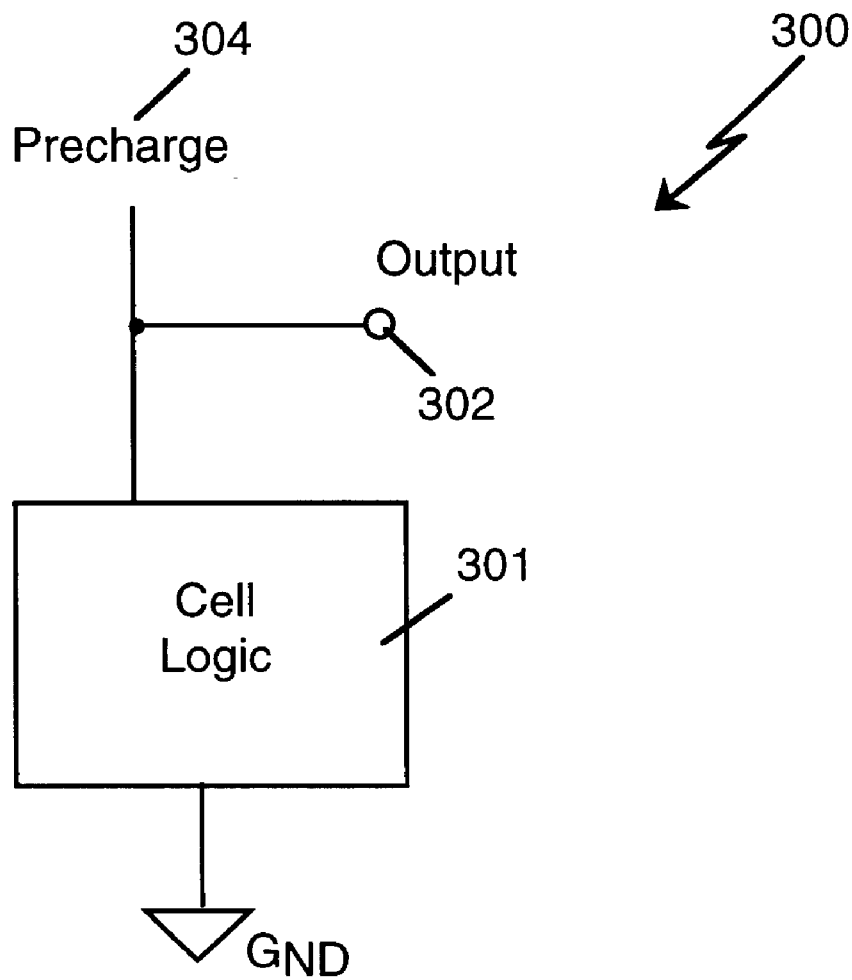
FIG. 3 is a block diagram of the relevant portions of a read output of a conventional memory.

FIG. 5 shows a block diagram of an exemplary embodiment of the present invention, in which the dynamic bolt-on circuit 553 is disposed between an output 552 of a conventional memory cell logic 551, e.g., similar to one shown in FIG. 3. The output 552 may represent outputs of one or more banks of memory cells as previously discussed. The output 552 may also be precharged by a conventional precharge and hold circuit as previously described, e.g., in connection with FIG. 2.

The dynamic bolt-on circuit 553 receives a control signal 554, and in response thereto pulls down the output 552 to the ground (GND) level. Although FIG. 5 shows that the output 552 is pulled down to the GND voltage level, it should be apparent to one of ordinary skill that the output can be pulled up high to the supply voltage ($V_{DD}$), and the read outputs 552 can thus be set to a deterministic value.

FIG. 5A shows a preferred embodiment of the deterministic output ensuring circuit 500 implementing the above described inventive method of FIG. 4, and showing more details of the dynamic bolt-on circuit of FIG. 5. The deterministic output ensuring circuit 500 comprises a precharge and hold circuit shown in FIG. 2. The precharge and hold circuit is advantageously modified to include the transistors $Q_A$ 511, $Q_B$ 512 and $Q_c$ 513 each having a gate voltage being provided by the port 1 write enable 502, the match signal 504 and the port 2 write enable 503, respectively.

The transistor Q1 505 ensures the precharging of the bank of outputs of the port pad 510 only during a proper clock cycle, e.g., when the clock signal received from the clock input 501 is LOW. The transistor Q2 506 ensures the precharging of the bank of outputs of the port pad 510 is not pulled down to GND during a precharge phase, i.e., when clock is LOW. The transistors, Q3 507, Q4 508 and Q5 509 collectively regulate the holding of the charge during the next clock cycle, e.g., while the clock is HIGH.

The precharge and hold circuit 500 further includes a dynamic bolt-on circuit comprising transistors $Q_A$ 511, $Q_B$ 512 and $Q_C$ 513 each having a gate voltage being provided by the port 1 write enable 502, the match signal 504 and the port 2 write enable 503, respectively. Transistor $Q_A$ 511 is turned on when the port 1 write enable 502 is HIGH, i.e., when a write operation is being performed at the port 1. When transistor $Q_A$ 511 is turned on, the voltage level at the precharge node 514 is pulled down to the voltage level of the drain of the transistor $Q_B$ 512.

Transistor $Q_B$ 512 in turn is turned on when the match signal 504 is HIGH. The match signal 504 is generated by comparing the respective addresses being accessed by each of the ports, port 1 and port 2. For example, a plurality of XNOR (exclusive NOR) gates (not shown) may be provided to each perform an exclusive NOR operation with each of the corresponding bits of the address signal at port 1 and port 2. The outputs of the plurality of XNOR gates may be in turn ANDed together to produce the match signal 504, (which is HIGH when there is a match between every corresponding bits of the address signals of the port 1 and port 2). When transistor $Q_B$ 512 is turned on, and at the same time transistor $Q_A$ 511 is turned on, the voltage level at the precharge node 514 is pulled down to ground (GND) voltage level.

Transistor Qc 513 is turned on when the port 2 write enable 503 is HIGH, i.e,. when a write operation is being performed at the port 2. When transistor $Q_C$ 513 is turned on, the voltage level at the node 516 (i.e., same as node 514) is pulled down to ground (GND) voltage level regardless of the state of the hold transistor Q3 507.

Thus, it can be appreciated that when, both ports 1 and 2 are accessing the same address, the read outputs at the port 510 are dynamically pulled down to a deterministic voltage level, e.g., the GND voltage, i.e., a hard 0, by the dynamic bolt-on circuit of the above example. Although in the above example, the read outputs are pulled down to GND, it should be readily apparent to those skilled in circuit design that the deterministic voltage may also be the supply voltage $V_{DD}$, i.e., a hard 1.

Moreover, it can be appreciated that the dynamic bolt-on circuit described above sets the read outputs to a known voltage level during a dual access ensuring stable operation of the memory device. Yet the dynamic bolt-on circuit requires very small additional circuit elements, i.e., three transistors, which have a very minimal impact on the speed performance of the device, and require no modification to the decode/arbitration logic circuitry.

Figure 6:
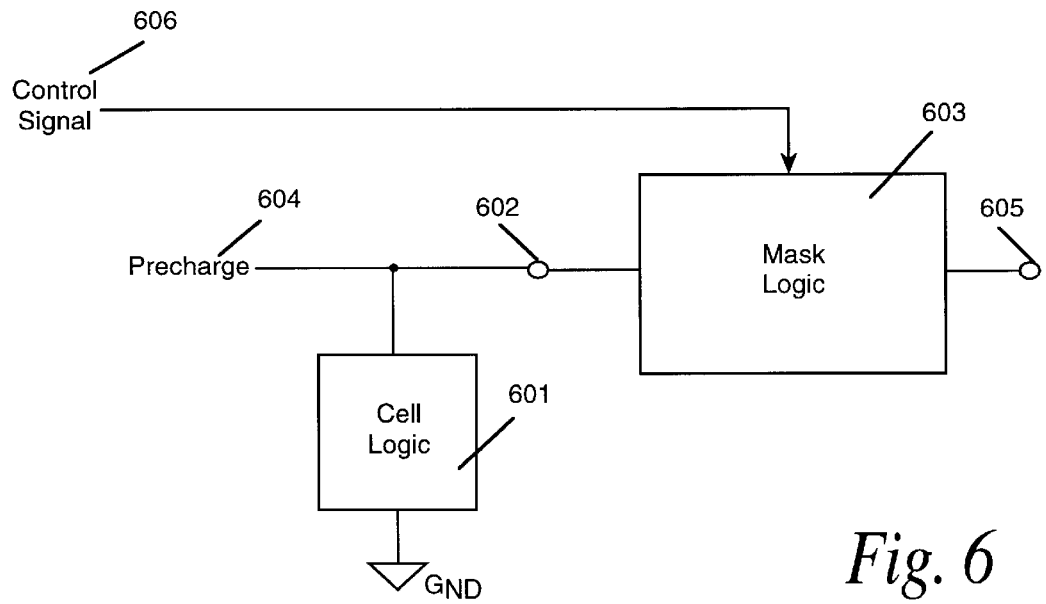
FIG. 6 is a block diagram of the relevant portions of an alternative exemplary embodiment of the device to ensure deterministic read outputs in accordance with the principles of the present invention.

FIG. 6 shows an alternative embodiment. FIG. 6 shows a single memory cell logic 601 having an output 602 connected to the precharge signal 604. The cell logic 601 operates similarly to a conventional cell logic, e.g., the cell logic 300 shown in FIG. 3. In this embodiment, a mask logic 603 is provided to mask the output 602 of the cell logic 601 to produce a deterministic value, i.e., a hard 1 or hard 0, at the masked output 605. The mask logic receives a control signal 606 regardless of what the output value of the output 602 may be. In response to the control signal 606, the mask logic (e.g., when the control signal 606 is HIGH) outputs a predetermined value at the output 605.

Figure 6A:
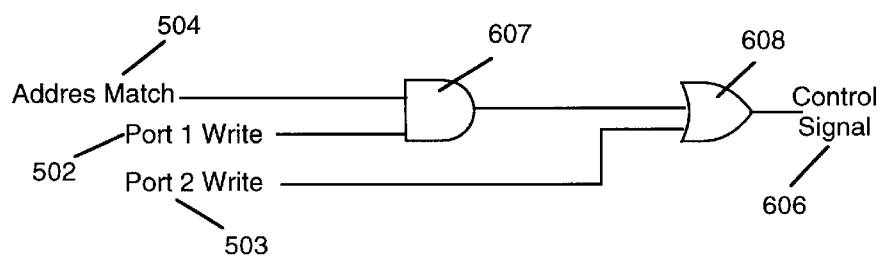
FIG. 6A is a logic diagram of an exemplary embodiment of the control signal of the device to ensure deterministic read outputs shown in FIG. 6 in accordance with the principles of the present invention.

An exemplar embodiment of the control signal 606 is shown in FIG. 6A. In FIG. 6A, the port 1 write enable 502, the port 2 write enable 503 and the address match signal 504 (as previously described) are fed to the AND gate 607 and the OR gate 608 to produce the control signal 606 as shown. The logic arrangement of FIG. 6A implements the truth logic representing the logic of the flow diagram shown in FIG. 4.

The mask logic 603 may be implemented as a combinational logic circuit having small number of gates, e.g., AND gates and/or OR gates, and provided to each bank of cells (rather than to each cells), thus requiring very small semiconductor space, and resulting a very small impact on the speed performance. Other arrangements for the mask logic are possible.

While the invention has been described with reference to the exemplary embodiments thereof, those skilled in the art will be able to make various modifications to the described embodiments of the invention without departing from the true spirit and scope of the invention. The terms and descriptions used herein are set forth by way of illustration only and are not meant as limitations. In particular, although the method of the present invention has been described by examples, the steps of the method may be performed in a different order than illustrated or simultaneously. Those skilled in the art will recognize that these and other variations are possible within the spirit and scope of the invention as defined in the following claims and their equivalents.

What is claimed is:

1. A method of providing a deterministic read output value for a multi-port memory having at least a first port and a second port, comprising:

detecting an access to a first address through said first port;

detecting an access to a second address through said second port;

comparing said first address and said second address; and setting an output read value of at least one output of said multi-port memory at a predetermined voltage level if the comparing step concludes said first address matches said second address. dynamic bolt-on circuit to set an output read value of at least one output of said multi-port memory at a predetermined voltage level regardless of a value that the multi-port memory alone would have obtained.

2. The method of providing a deterministic read output value of a multi-port memory in accordance with claim 1, wherein said step of setting an output value further comprises:

setting said output value at substantially zero volts.

3. The method of providing a deterministic read output value of a multi-port memory in accordance with claim 2, wherein said step of setting an output value further comprises:

pulling down a precharge signal associated with said at least one output to ground.

4. The method of providing a deterministic read output value of a multi-port memory in accordance with claim 1, wherein said step of setting an output value further comprises:

setting said output value at a voltage level that substantially equals a supply voltage level.

5. The method of providing a deterministic read output value of a multi-port memory in accordance with claim 4, wherein said step of setting an output value further comprises:

pulling up a precharge signal associated with said at least one output to a supply voltage level.

6. The method of providing a deterministic read output value of a multi-port memory in accordance with claim 1, wherein said step of setting an output value further comprises:

providing a logic circuit to mask said at least one output to provide said predetermined voltage level regardless of an actual voltage level of said at least one output.

7. An apparatus for providing a deterministic read output value of a multi-port memory having at least a first port and a second port, comprising:

means for detecting an access to a first address through said first port;

means for detecting an access to a second address through said second port;

means for comparing said first address and said second address; and means for setting an output value of at least one output of said multi-port memory at a predetermined voltage level if the means for comparing results shows said first address matches said second address.

8. The apparatus for providing a deterministic read output value of a multi-port memory in accordance with claim 7, wherein:

said means for setting said output value sets said output value at substantially zero volts.

9. The apparatus for providing a deterministic read output value of a multi-port memory in accordance with claim 8, wherein:

said means for setting an output value is adapted to pull down a precharge signal associated with at least one output to ground.

10. The apparatus for providing a deterministic read output value of a multi-port memory in accordance with claim 8, wherein:

said means for setting an output value is adapted to pull up a precharge signal associated with said at least one output to ground.

11. The apparatus for providing a deterministic read output value of a multi-port memory in accordance with claim 7, wherein:

said means for setting said output value sets said output value at a voltage level that substantially equals a supply voltage level.

12. The apparatus for providing a deterministic read output value of a multi-port memory in accordance with claim 7, wherein:

said means for setting an output value comprises a logic circuitry adapted to mask said at least one output to provide said predetermined voltage level regardless of an actual voltage level of said at least one output.

13. The apparatus for providing a deterministic read output value of a multi-port memory in accordance with claim 7, wherein:

said first port is a write port, and wherein said second port is a read/write port.

14. A dynamic bolt-on circuit for a memory having at least a first port and a second port, comprising:

a precharge signal path adapted to precharge a plurality of read outputs with a first voltage level;

a hold transistor coupled to the precharge signal path to maintain the first voltage level when the precharge signal path is inactive;

a first switch disposed to provide an electrical connection between said precharge signal path and a second voltage level forcing the plurality of read outputs to the second voltage level regardless of a state of the hold transistor or a state of a memory cell that is being read from when said first switch is closed; and a first signal path adapted to receive a control signal, said control signal controlling opening and closing of said first switch, wherein said first switch generates the second voltage level at a read output when closed and has no effect on the read output when open.

15. The dynamic bolt-on circuit for a memory according to claim 14, wherein:

said control signal comprises a match signal, said match signal being active to close said first switch when respective addresses of said first port and said second port match each other.

16. The dynamic bolt-on circuit for a memory according to claim 14, wherein:

said first switch comprises a transistor disposed between said precharge signal path and said second voltage level.

17. The dynamic bolt-on circuit for a memory according to claim 14, further comprising:

a second switch disposed to provide an electrical connection between said precharge signal path and a second voltage level when said second switch is closed; and a second signal path adapted to receive a first write enable, said first write enable controlling opening and closing of said second switch, said first write enable enabling a write operation to be performed at said first port.

18. The dynamic bolt-on circuit for a memory according to claim 17, further comprising:

a third switch disposed to provide an electrical connection between said precharge signal path and said first switch when said third switch is closed; and a third signal path adapted to receive a second write enable, said second write enable controlling opening and closing of said third switch, and said second write enable enabling a write operation to be performed at said second port.

19. The dynamic bolt-on circuit for a memory according to claim 14, wherein:

said first voltage level substantially equals a supply voltage level; and wherein said second voltage level substantially equals zero voltage.

20. The dynamic bolt-on circuitry for a memory according to claim 14, wherein:

said first port is a write port, and wherein said second port is a read/write port.

* * * * *

UNITED STATES PATENT AND TRADEMARK OFFICE
CERTIFICATE OF CORRECTION

PATENT NO.      : 6,317,379 B1
DATED           : November 13, 2001
INVENTOR(S)     : Argyres It is certified that error appears in the above-identified patent and that said Letters Patent is hereby corrected as shown below:

<u>Column 7,</u>
Line 4, delete "setting an output read value at least one output of said multi-port memory at a predetermined voltage level"
Line 7, after "second" delete "address." and insert therefor -- address, --
Line 7, before "dynamic" insert -- using a --

<u>Column 8,</u>
Line 6, delete "ground" and insert therefor -- a supply voltage level --

Signed and Sealed this

Fourteenth Day of October, 2003

JAMES E. ROGAN
*Director of the United States Patent and Trademark Office*